United States Patent

Adams et al.

[11] Patent Number: 6,108,362
[45] Date of Patent: Aug. 22, 2000

[54] BROADBAND TUNABLE SEMICONDUCTOR LASER SOURCE

[75] Inventors: Laura Ellen Adams, Basking Ridge; Clyde George Bethea, Edison; Wei-Chiao Fang, Middletown, all of N.J.; Gerald Nykolak, Long Beach Long Island, N.Y.; Roosevelt People, Plainfield, N.J.; Arthur Mike Sergent, New Providence, N.J.; Tawee Tanbun-Ek, Califon, N.J.; Won-Tien Tsang, Holmdel, N.J.

[73] Assignee: Lucent Technologies Inc., Murray Hill, N.J.

[21] Appl. No.: 08/954,305

[22] Filed: Oct. 17, 1997

[51] Int. Cl.[7] .................................. H01S 5/00; H01S 3/08
[52] U.S. Cl. ................................................ 372/50; 372/96
[58] Field of Search .................................. 372/96, 50, 20, 372/23

[56] References Cited

U.S. PATENT DOCUMENTS

| | | | |
|---|---|---|---|
| 4,961,198 | 10/1990 | Ishino et al. | 372/50 |
| 5,119,393 | 6/1992 | Oka et al. | 372/50 |
| 5,347,528 | 9/1994 | Suzuki et al. | 372/20 |
| 5,606,573 | 2/1997 | Tsang | 372/96 |

FOREIGN PATENT DOCUMENTS

762577A1  3/1997  European Pat. Off. ........ H01S 3/103

OTHER PUBLICATIONS

T. Numai, 1.5–$\mu$m Wavelength Tunable Phase–shift Controlled Distributed Feedback Laser, J. Lightwave Tech., vol. 10, No. 2, pp. 199–205 (Feb. 1992).

W.T. Tsang et al., Control of Lasing Wavelength in Distributed Feedback Lasers by Angling the Active Stripe with Respect to the Grating, IEEE Photonics Tech. Lett., vol. 5, No. 9, pp. 978–980 (Sep. 1993).

H. Nakajima et al., Absorption–controlled tunable DFB amplifier–filters, Electronic Lett., vol. 30, No. 16, pp. 1294–1296 (Aug. 1994).

H. Hillmer et al., Tailored DFB Laser Properties by Individually Chirped Gratings Using Bent Waveguides, IEEE J. Selected Topics in Quantum Electronics, vol. 1, No. 2, pp. 356–362 (Jun. 1995).

H. Nakajima et al., Very high speed wavelength switching capability Franz–Keldysh electroabsorption DFB lasers, OFC '96 Technical Digest, p. 276 (1996) (No Month Available).

L. E. Adams et al., System Performance of High–Speed Broadband–Tunable Laser for Wavelength Conversion in WDM Networks, OFC '97, Postdeadline Paper No. PD11, pp. 1–4 (Feb. 1997).

T. Tanbun–Ek et al., Tunable Electroabsorption Modulated Laser Integrated with a Bent Waveguide Distributed–Feedback Laser, IEEE Photonics Tech. Lett., vol. 9, No. 5, pp. 563–565(May 1997).

*Primary Examiner*—Teresa M. Arroyo
*Assistant Examiner*—Q. P. Leung

[57] ABSTRACT

A tunable semiconductor laser comprises a gain section having an MQW active region, a uniform pitch grating DFB region, and first waveguide. A composite reflector, including a second MQW region and a second waveguide, forms a cavity resonator with the DFB region. A voltage applied to the composite reflector induces a quantum confined stark effect, thereby allowing the wavelength to be altered. In one embodiment, the current drive to the active region and the shape of the first waveguide (e.g., a raised-sine function) are mutually adapted so that N longitudinal modes have essentially the same threshold gain and so that the DFB region spanned by the first waveguide is segmented into N zones, each zone providing optical feedback at a different wavelength corresponding to a different longitudinal mode.

8 Claims, 1 Drawing Sheet

BROADBAND TUNABLE SEMICONDUCTOR LASER SOURCE

CROSS REFERENCE TO RELATED APPLICATIONS

This application was concurrently filed with application Ser. No. 08/954,575 entitled Sub-Carrier Multiplexing in Broadband Optical Networks (Adams 2-17-7-6-12), with application Ser. No. 08/954,022 now U.S. Pat. No. 5,991,323 entitled Laser Transmitter for Reduced Signal Distortion (Adams 3-18-8-7-13), and with application Ser. No. 08/954,376 now U.S. Pat. No. 5,991,061 entitled Laser for Reduced SBS (Adams 4-19-7-9-8-14).

FIELD OF THE INVENTION

This invention relates generally to tunable semiconductor lasers and, more particularly, to laser sources which can be switched between different wavelength outputs over a relatively broadband.

BACKGROUND OF THE INVENTION

In wavelength division multiplex (WDM) optical communication systems, a plurality of optical carrier signals each having a different wavelength are multiplexed as separate transmission channels onto a single optical fiber. Distributed feedback (DFB) semiconductor lasers are the light sources of choice for generating the carrier signals. Early designs contemplated that separate lasers, each with a different grating period (or pitch) corresponding to a different wavelength, would be assigned to each channel. However, as pointed out by W-T. Tsang in U.S. Pat. No. 5,606,573 issued on Feb. 25, 1997 (incorporated herein by reference), this approach requires that the grating pitch difference between lasers be on the order of 0.1 nm for nominally 1550 nm DFB lasers. Such tight control of pitch strains the capability of both holographic and contact printing techniques used to make the gratings. Accordingly, Tsang proposed a laser design in which the laser-to-laser grating pitch is constant, but the active stripe is oriented at an angle to the transmission axis. The angle is varied from laser to laser to generate lasers having different wavelength outputs. Keeping the grating pitch constant simplifies the manufacturing process in one respect, but this advantage is to some extent offset by the need to vary the orientation of the active stripe from laser to laser.

Others have proposed lasers in which the physical design is fixed and the output wavelength is tuned electrically. Thus, a plurality of lasers all having the same physical design (but different electrical inputs) could provide all of the carrier signals of a WDM system. Alternatively, a single laser could provide all of the carrier signals provided two principal requirements are met: first, the laser has to be tunable over the spectrum spanned by the system channels; and second, the laser has to be switchable between different wavelength outputs at relatively high speeds. For example, H. Nakajima et al., *OFC Technical Digest*, p. 276, Paper ThQ5 (Feb. 1996; incorporated herein by reference) report a buried ridge structure DFB laser comprising two DFB gain sections separated by an intracavity Franz-Keldysh (F-K) electroabsorption bulk section. The latter provides wavelength control by an applied reverse bias voltage. The authors report that the laser was tuned at relatively high speeds but only over a relatively narrow wavelength range of 0.2 nm. In contrast, H. Hillmer et al., IEEE J. *Selected Topics in Quantum Electronics*, Vol. 1, No. 2, pp. 356–362 (1995; incorporated herein by reference), report a DFB multiquantum well (MQW) laser comprising a chirped grating and a bent active waveguide having a tilted half-sine shape. Three electrodes apply three separate currents to different sections of the active waveguide in order to tune the wavelength of the output. Compared to the Nakajima et al. laser, an order of magnitude improvement in tuning range (5.5 nm) was demonstrated but only at relatively slow speeds (i.e., at DC). One would expect the tuning range at high speeds to be considerably less.

However, some optical systems (e.g., packet switching systems) require relatively high speed tuning over a broader range (e.g., several nm), whereas other systems (e.g., WDM transmission systems) require less speed but demand a much broader tuning range (e.g., 10–12 nm).

SUMMARY OF THE INVENTION

A broadband, tunable laser provides an optical output signal in any one of N different longitudinal modes at wavelengths corresponding, for example, to the N channels of a WDM system. The laser comprises an MQW active region, a DFB region for selecting the nominal wavelength of stimulated emission (i.e., laser light) generated by the active region, and a first waveguide optically coupled to the active region to permit egress of the laser output signal. The tunable laser is characterized in that a composite second reflector is coupled to one end of the first waveguide so as to form a cavity resonator with the DFB region. In accordance with one aspect of our invention, the second reflector includes an MQW second region optically coupled to the MQW active region, a second waveguide having one end optically coupled to the first waveguide, and a high reflectivity dielectric layer disposed at the other end of the second waveguide. In order to modulate the wavelength of the laser light, a voltage is applied to the MQW second region to induce changes in refractive index through the Quantum Confined Stark Effect (QCSE). Further in accordance with our invention, the current applied to the DFB region and shape of the first waveguide are mutually adapted so that a portion of the DFB region spanned by the first waveguide is segmented into at least N zones, each zone providing optical feedback at a different wavelength corresponding to the N channels of the WDM system.

Our tunable laser has exhibited high speed tuning over a range of about 1.7 nm, an order of magnitude improvement over the results reported by Nakajima et al. and a low speed tuning range of about 12 nm, more than double that reported by Hillimer et al.

BRIEF DESCRIPTION OF THE DRAWINGS

Our invention, together with its various features and advantages, can be readily understood from the following more detailed description taken in conjunction with the accompanying drawing, in which.

In the interests of simplicity and clarity, the figures have not been drawn to scale.

DETAILED DESCRIPTION OF THE INVENTION

Figure 1:
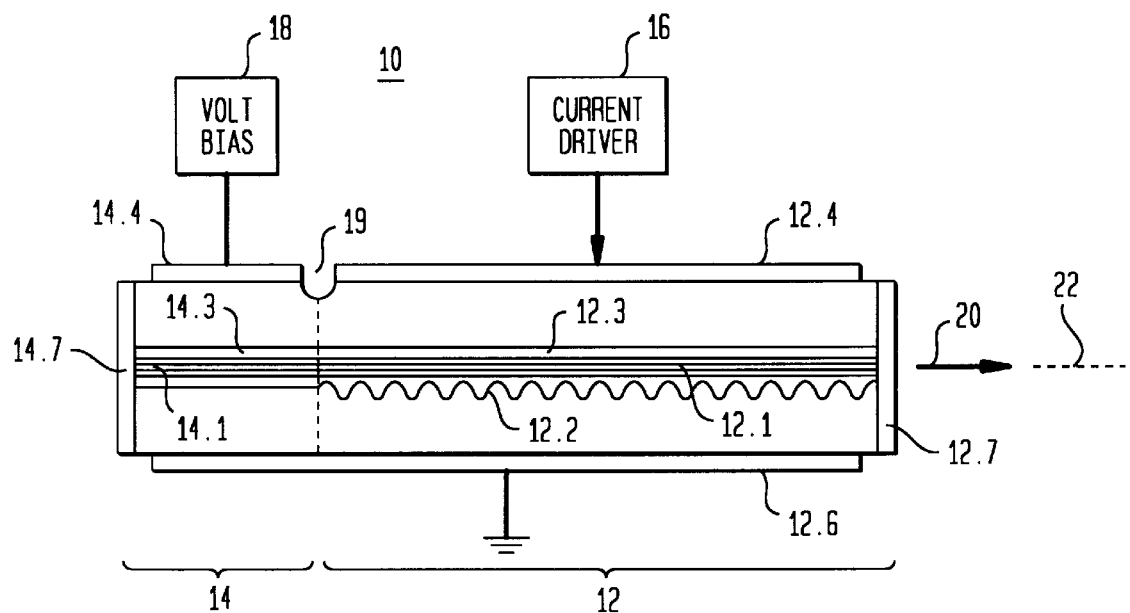
FIG. 1 is a schematic cross-sectional view of a tunable semiconductor laser in accordance with one embodiment of our invention.
Figure 2:
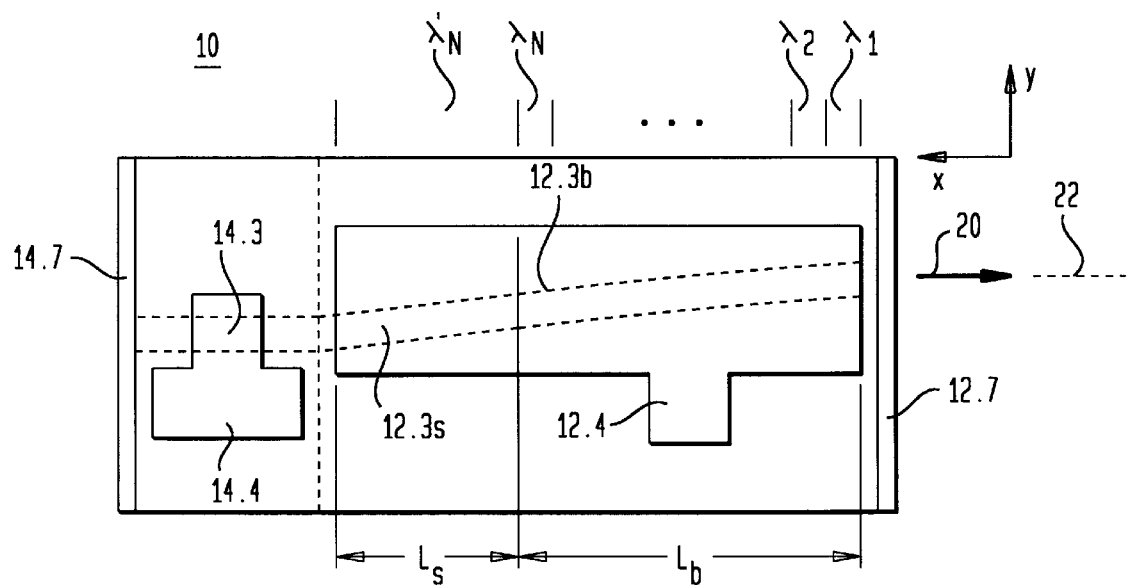
FIG. 2 is a schematic top view of the laser of FIG. 1.

With reference now to FIGS. 1 and 2, a broadband tunable laser source 10 generates an optical output signal 20 in any one of a plurality of N longitudinal modes each having a different wavelength $\lambda_i$ (i=1,2, . . . N). The output signal 20 propagates along a transmission axis 22 of, for example, a WDM system (not shown). The systems contemplated may embrace low speed applications (e.g., relatively slow speed wavelength interchangers) as well as relatively high speed applications (e.g., optical packet switches). In any case, the tunable source 10 comprises a cavity resonator formed by a gain section 12 and a composite reflector section 14.

The gain section 12 includes a relatively wide effective bandgap MQW active region 12.1, a DFB region 12.2 comprising a uniform pitch grating optically coupled to the active region, and a relatively narrower bandgap first waveguide 12.3 optically coupled to the active region. The output of the waveguide 12.3 is coupled to transmission axis 22 through a relatively low reflectivity dielectric layer (or composite of layers; e.g., an AR coating) 12.7. When current driver 16 supplies above-threshold forward bias current to the active region via electrodes 12.4 and 12.6, the laser source 10 generates light (radiation) at a wavelength determined by the composition and gain spectrum of the MQW region. In the absence of tuning mechanisms, the pitch of the DFB grating determines which longitudinal mode within the gain spectrum is selected. This mode is coupled into the first waveguide 12.3 and provides the laser output 20. As discussed later, any one of a plurality of N longitudinal modes at different wavelengths can be selected by modifying the laser design in accordance with various aspects of our invention.

In one aspect, the laser source 10 is provided with the composite reflector section 14 which, as indicated above, forms a cavity resonator with the gain section 12 (i.e., with the DFB region 12.2). More specifically, section 14 includes an MQW second region 14.1 optically coupled to the MQW active region 12.1, a second waveguide 14.3 having one end optically coupled to the first waveguide 12.3, and a relatively high reflectivity dielectric layer (or composite of layers; e.g., an HR coating) 14.7 disposed at the other end of the second waveguide 14.3.

In a second aspect shown in FIG. 2, the laser source 10 is provided with a first waveguide 12.3 having a predetermined shape (e.g., a raised-sine shape) which effectively segments the portion 12.3b of the waveguide 12.3 (i.e., the portion under electrode 12.4) into N zones corresponding to the N different wavelengths of WDM system (i.e., the channel wavelengths). These zones, labeled $\lambda_i$ (i=1,2 . . . N) in FIG. 2, each provide optical feedback at a different wavelength because the waveguide 12.3b has a different slope (i.e., relative to the grating lines) within each zone. However, continuous tuning over the range $\lambda_1$ to $\lambda_N$ is possible only if all of the longitudinal modes corresponding to these wavelengths have essentially the same threshold gains. This desideratum is achieved by a combination of the shape of the waveguide 12.3b (which determines the flatness of the gain spectrum of the modes) and the drive current (which determines the gain of the MQW active region 12.1). In addition, modes corresponding to zones in which the waveguide slope is larger experience higher loss. To compensate for the higher loss in the longest wavelength zone $\lambda_N$, which has the highest waveguide slope, the waveguide 12.3 is provided with a straight (i.e., linear) portion 12.3s disposed between the shaped portion 12.3b and the second waveguide 14.3 of the composite reflector section 14. Since the electrode 12.4 overlaps the portion 12.3s, the Nth mode is provided with additional gain to offset the higher losses (i.e., the zone for the Nth mode includes not only the region labeled $\lambda_N$ under electrode 12.3b in FIG. 2, but also the region labeled $\lambda_N$ under electrode 12.3s).

The shape y(x) of the waveguide portions 12.3b and 12.3s and their corresponding grating pitch functions $\Lambda(x)$ can be described by a set of equations as follows. In the range $L_s \leq x \leq L_B$ the shape of the waveguide 12.3b follows essentially a raised-sine shape given by $$y_b = W + (W/L_b)(2L_s - x) + (W/\pi)\sin(\pi x/L_b) \tag{1}$$

where x is distance along the direction of light propagation (e.g., along transmission axis 22), W is the maximum displacement of y(x) from axis 22 in the case where the straight portion 12.3s is omitted, $L_s$ is the length of the straight waveguide portion 12.3s, and $L_b$ is the length of the shaped waveguide portion 12.3b. The corresponding grating pitch is given by $$\Lambda_b = \Lambda_0[1 + (W/L_b)^2(\cos\pi x/L_b - 1)^2]^{1/2} \tag{2}$$

where $\Lambda_0$ is the pitch of the uniform grating of the DFB region 12.2. In contrast, in the range $L_b \leq x \leq (L_b + L_s)$ the shape of the waveguide 12.3s follows a straight line function given by $$y_s = 2W + (2W/L_b)(L_s - x) \tag{3}$$

whereas the grating pitch is given by $$\Lambda_s = \Lambda_0[1 + (2W/L_b)^2]^{1/2} \tag{4}$$

Although the combination of a raised-sine function and a straight line function for the two waveguide segments is preferred, other functions can be utilized depending on the particular application contemplated.

In a third aspect of our invention, the laser source 10 is provided with means for applying an electrical control signal to the composite reflector section 14 which effectively alters the phase of light propagating in the second waveguide 14.3 and hence in the laser source as a whole. Illustratively, an electrical signal from source 18 is applied to section 14 via electrodes 14.4 and 12.6. The signal may take on several forms (i.e., current or voltage), but is preferably a reverse bias voltage which induces the Quantum Confined Stark Effect (QCSE) in the MQW second region 14.3. The QCSE, in turn, induces changes in the refractive index of the MQW region 14.3 and hence in the phase of the light propagating in the second waveguide 14.3. Therefore, by varying the applied voltage the laser source 10 can be tuned over a relatively broad range of wavelengths corresponding the wavelengths spanned by the N zones of the first waveguide 12.3.

In general, varying only a single parameter, such as the control voltage level applied to the composite reflector section 14 enables the wavelength of the laser source to be tuned over a moderately broad range (e.g., about 2 nm) at relatively high speeds (e.g., 50–100 ps). However, varying several parameters, such as the control voltage level, the drive current and the temperature of the laser, enables tuning over a much broader wavelength range (e.g., 10–12 nm), albeit at more modest speeds (e.g., in the millisecond to nanosecond range).

The following examples demonstrate the efficacy of our invention for both relatively low speed and relatively high speed applications. The various materials, dimensions, operating conditions and other parameters are provided by way of illustration only, and are not to be construed as limitations on the scope of the invention unless expressly so indicated.

EXAMPLE I

A laser source 10 was fabricated using selective area growth MOVPE to grow the various semiconductor layers and standard processing to etch shapes, deposit electrodes and the like. The MQW regions 12.3 and 14.3 comprised 7 layers of strained InGaAsP (1.55 μm bandgap) interleaved with barrier layers of InGaAsP (1.28 μm bandgap). Transverse mode control was accomplished by forming a 1 μm wide well-known CMBH structure. InP:Fe current blocking layers 3 μm thick were formed on either side of the CMBH structure in order to reduce leakage current and parasitic capacitance. A shallow groove 19 about 80 μm long was used to enhance electrical isolation with a typical resistance of 25 kΩ. The waveguides 12.3b and 12.3s had shapes defined essentially by equations (1) and (3) above and were designed to provide gain in eight longitudinal modes corresponding to eight channels (each about 1.4 nm wide) of a WDM system at wavelengths ranging from 1549.4 to 1560.7 nm.

We were able to tune the laser source through all eight channels (over more than an 11 nm range) by appropriate choice of bias voltage, drive current and temperature. The typical power delivered into a single mode fiber was 10 mW at a drive current of 60 mA. The mean side mode suppression ratio was about 36 dB. The following table illustrates how the three parameters were varied to achieve tuning over a relatively broad 11 nm range.

| CHANNEL NO. | WAVE-LENGTH (nm) | TEMPERATURE (° C.) | BIAS VOLTAGE (V) | DRIVE CURRENT (mA) |
|---|---|---|---|---|
| 1 | 1549.42 | 25 | −1.80 | 60 |
| 2 | 1551.02 | 25 | 0.00 | 60 |
| 3 | 1552.63 | 25 | 0.00 | 70 |
| 4 | 1554.25 | 25 | 1.10 | 170 |
| 5 | 1555.86 | 25 | 1.73 | 320 |
| 6 | 1557.47 | 35 | 1.67 | 300 |
| 7 | 1559.09 | 45 | 2.30 | 290 |
| 8 | 1560.72 | 50 | 2.40 | 290 |

This low speed tuning range of 11 nm is more than double the best result reported in the prior art (Cf. Hillmer et al., supra).

EXAMPLE II

A laser source similar to the one described in Example I was utilized to demonstrate single parameter, high speed tuning over a relatively broad wavelength range. The single parameter varied was the bias voltage applied to the composite reflector section 14. When driven with a bias voltage having a 350 ps, period the laser output tuned back and forth between high (1551.7 nm) and low (1550.0 nm) wavelengths at the same rate. The output switched from short to long wavelength over a 1.7 nm range in 56 ps and switched back in 134 ps (10% to 90% rise time). The side mode suppression ratio was about 35 dB during tuning. This high speed tuning range is nearly an order of magnitude better than that previously reported by the prior art (Cf., Nakajima et al, supra). High speed switching between four channels (channel spacing 0.7 nm) was also demonstrated using a 4-level bias voltage. The ability of our tunable laser source to address multiple WDM channels and to switch between them at very high speeds should enable optical routing on a cell-by-cell basis in a WDM network without requiring large guard times.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. For example, in long distance transmission systems a narrow linewidth laser source is particularly important because fiber dispersion tends to increase pulse width. But, spatial hole burning in the laser, which can be caused by non-uniform current drive, tends to increase linewidth. Therefore, it is particularly advantageous that the drive current be applied substantially uniformly to the MQW active region 12.1. To this end, it is preferable that the electrode 12.4 be a single, non-segmented electrode and, likewise, that the active region 12.1 be a single, non-segmented region. By employing these features in our invention we were able to obtain linewidths of 1–2 MHz, which we expect would be an order of magnitude improvement compared to prior art segmented designs (Cf., Hillmer et al. and Nakajima et al., supra).

What is claimed is:

1. A tunable laser source for providing an optical output signal in any one of N different longitudinal modes, comprising a gain section including an MQW active region, a DFB region optically coupled to said active region for selecting the nominal wavelength of the longitudinal mode which lases, and a first waveguide optically coupled to said active region to permit egress of the laser output signal, characterized in that a composite reflector is optically coupled to one end of said first waveguide so as to form a cavity resonator with said DFB region, said composite reflector including an MQW second region optically coupled to said MQW active region, a second waveguide having one end optically coupled to said first waveguide, and a relatively high reflectivity dielectric layer disposed at the other end of said second waveguide, a first electrode that enables voltage to be applied to said MQW second region to induce therein a quantum confined stark effect, thereby to alter the wavelength of said output signal, and a second electrode that enables drive current to be applied to said active region, and the current applied to said active region and the shape of said first waveguide are mutually adapted so that said N longitudinal modes have essentially the same threshold gain and so that a portion of said DFB region spanned by said first waveguide is segmented into N zones, each zone providing optical feedback at a different wavelength corresponding to a different one of said longitudinal modes.

2. The invention of claim 1 wherein said first waveguide has a first portion the shape of which corresponds essentially to a raised-sine function in the plane of said waveguide.

3. The invention of claim 2 wherein said first portion has a raised-sine function of the form defined by equation (1).

4. The invention of claim 2 wherein said first waveguide has a second portion disposed between said first portion and said composite reflector, the shape of said second portion corresponding essentially to a straight line function.

5. The invention of claim 4 wherein said second portion corresponds with the highest wavelength one of said zones, and said second electrode means applies drive current to said first and second portions.

6. The invention of claim 1 wherein said active region is a single, non-segmented region and wheerein said second electrode comprises further including a single, non-segmented electrode for applying said current thereto in a substantially uniform manner.

7. A tunable laser source for providing an optical output signal in any one of N different longitudinal modes corresponding to N channels of a WDM system, comprising a gain section comprising a single, non-segmented InGaAsP MQW active region, a DFB region optically coupled to said active region, said DFB region including a grating of uniform pitch for selecting the nominal wavelength of the longitudinal mode which lases, a first InGaAsP waveguide optically coupled to said active region, and a relatively low reflectivity first dielectric reflector coupled to one end of said first waveguide to permit egress of said laser output signal a composite reflector optically coupled to the other end of said first waveguide so as to form a cavity resonator with said DFB region, said composite reflector including an InGaAsP MQW second region optically coupled to said MQW active region, a second InGaAsP waveguide having one end optically coupled to said first waveguide, and a relatively high reflectivity second dielectric reflector optically coupled to the other end of said second waveguide, said first waveguide including a first portion and a second portion optically coupling said first portion to said composite reflector, the shape of said first portion corresponding essentially to the raised-sine function of equation (1) and the shape of said second portion corresponding essentially to the straight line function of equation (3), and first electrode means for applying voltage to said MQW second region to induce therein a quantum confined stark effect, thereby to alter the wavelength of said output signal, and second electrode means for applying drive current to at least those sections of said active region optically coupled to said first waveguide, said second electrode means comprising a single, non-segmented electrode for applying current to said active region in a substantially uniform manner, wherein said current applied to said active region and the shape of said first waveguide are mutually adapted so that said N longitudinal modes have essentially the same threshold gain and so that a portion of said DFB region spanned by said first waveguide is segmented into N zones, each zone providing optical feedback at a different wavelength corresponding to a different one of said longitudinal modes and a different one said N channels.

8. The invention of claim 7 wherein said N channels span a wavelength range from about 1549 nm to 1561 nm and said laser source is continuously tunable over said range.

* * * * *